(12) United States Patent
Mikhailov

(10) Patent No.: US 8,967,826 B2
(45) Date of Patent: Mar. 3, 2015

(54) LASER APPARATUS FOR GENERATING A LINE-SHAPED INTENSITY DISTRIBUTION IN A WORKING PLANE

(75) Inventor: Aleksei Mikhailov, Dortmund (DE)

(73) Assignee: LIMO Patentverwaltung GmbH & Co. KG, Dortmund (DE)

(*) Notice: Subject to any disclaimer, the term of this patent is extended or adjusted under 35 U.S.C. 154(b) by 0 days.

(21) Appl. No.: 13/822,061

(22) PCT Filed: Sep. 8, 2011

(86) PCT No.: PCT/EP2011/065553
§ 371 (c)(1),
(2), (4) Date: Mar. 27, 2013

(87) PCT Pub. No.: WO2012/032116
PCT Pub. Date: Mar. 15, 2012

(65) Prior Publication Data
US 2013/0182435 A1    Jul. 18, 2013

(30) Foreign Application Priority Data
Sep. 9, 2010 (DE) .......................... 10 2010 044 875

(51) Int. Cl.
*F21V 7/00* (2006.01)
*B23K 26/06* (2014.01)
(Continued)

(52) U.S. Cl.
CPC ........... *F21V 7/0083* (2013.01); *B23K 26/0608* (2013.01); *B23K 26/0738* (2013.01); *G02B 27/095* (2013.01); *G03F 7/2053* (2013.01); *G02B 27/0905* (2013.01)
USPC ......................................... 362/247; 362/236

(58) Field of Classification Search
CPC ............ B23K 26/0608; B23K 26/0738; F21V 7/0083; G02B 27/095; G02B 27/0905; G03F 7/2053
USPC ............ 362/247, 237, 238, 242, 245, 249.14, 362/244, 211, 217.05, 236; 372/50.12–50.124; 359/626, 627, 636, 359/637, 638
See application file for complete search history.

(56) References Cited

U.S. PATENT DOCUMENTS

2002/0051360 A1    5/2002    Solodovnikov et al.
2003/0099267 A1    5/2003    Hennig et al.
(Continued)

FOREIGN PATENT DOCUMENTS

EP    1 619 765 A1    1/2006
EP    2 003 484 A1    12/2008
(Continued)

*Primary Examiner* — Anh Mai
*Assistant Examiner* — Glenn Zimmerman
(74) *Attorney, Agent, or Firm* — Laurence A. Greenberg; Werner H. Stemer; Ralph E. Locher

(57) ABSTRACT

An illumination apparatus produces a linear intensity distribution. The illumination apparatus contains laser light sources arranged in a number N of rows with in each case a number M of laser light sources which are arranged one next to the other, and emit laser light in a first propagation direction. A number of beam-deflection devices are arranged behind the laser light sources in the first propagation direction and deflect the laser light emitted by the laser light sources into a second propagation direction to a working plane. A beam-merging device is arranged behind the beam-deflection devices in the second propagation direction such that it merges the individual laser beam bundles of the laser light sources into the linear intensity distribution, with adjacent rows being arranged in a first direction perpendicular to first and second emission directions and also offset with respect to one another in the first propagation direction.

10 Claims, 6 Drawing Sheets

(51) Int. Cl.
*B23K 26/073* (2006.01)
*G02B 27/09* (2006.01)
*G03F 7/20* (2006.01)

(56) References Cited

U.S. PATENT DOCUMENTS

2004/0159802 A1* 8/2004 Ziener et al. ............ 250/504 R
2006/0018356 A1 1/2006 Voss et al.
2008/0121626 A1 5/2008 Thomas et al.
2008/0198893 A1 8/2008 Bartoschewski et al.
2008/0310027 A1* 12/2008 Wilson et al. ................ 359/641
2009/0129420 A1* 5/2009 Regaard et al. ............ 372/50.12
2011/0157706 A1* 6/2011 Mitra et al. .................... 359/619

FOREIGN PATENT DOCUMENTS

| WO | 02/50599 A1 | 6/2002 |
| WO | 2007/019878 A1 | 2/2007 |
| WO | 2008/002407 A2 | 1/2008 |

* cited by examiner

FIG. 3A
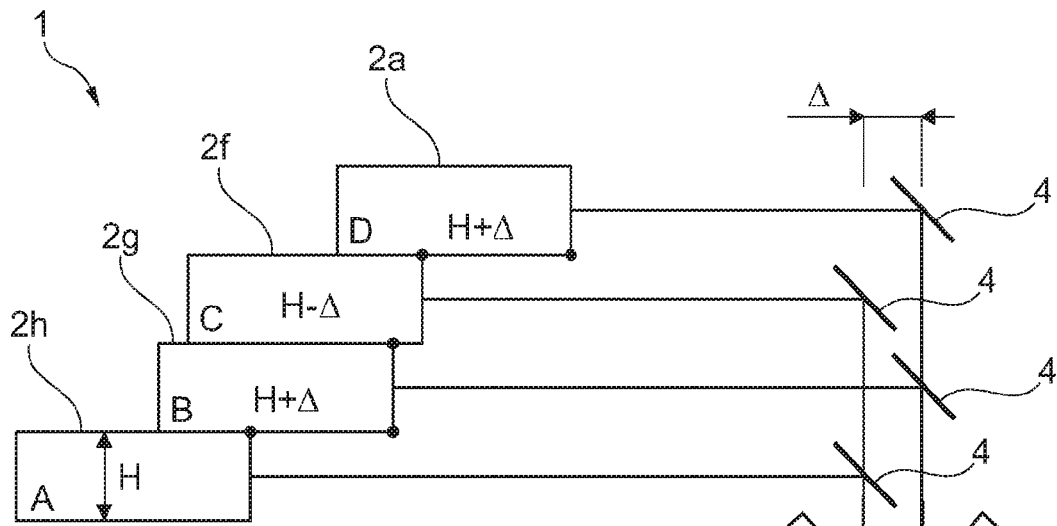
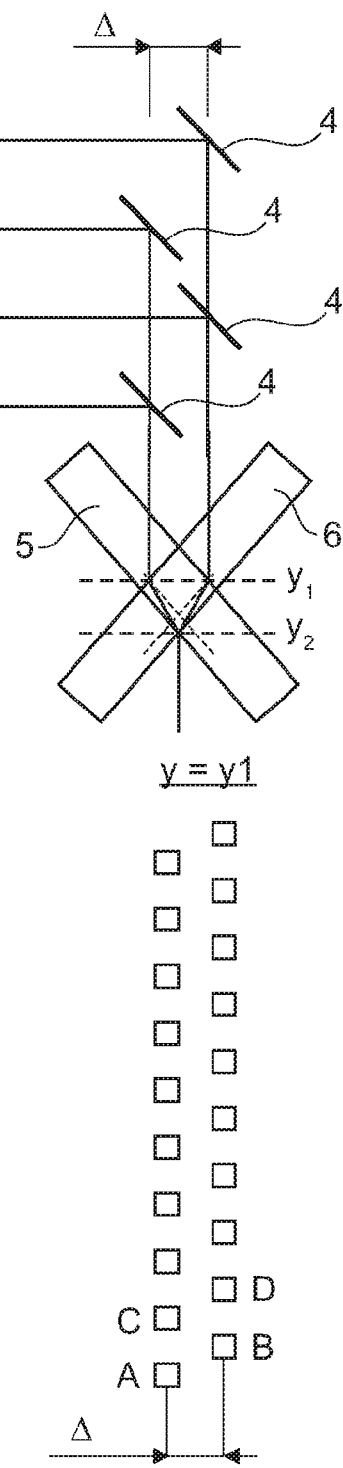
FIG. 3B

LASER APPARATUS FOR GENERATING A LINE-SHAPED INTENSITY DISTRIBUTION IN A WORKING PLANE

BACKGROUND OF THE INVENTION

Field of the Invention

The present invention relates to an illumination apparatus for generating a line-shaped intensity distribution in a working plane.

Definitions

In the propagation direction of the light means the mean propagation direction of the light, particularly if this is not a plane wave or if it is at least partly divergent. Unless explicitly specified otherwise, light ray, partial beam, ray or beam does not mean an idealized ray from geometric optics, but rather a real light ray, such as, for example, a laser ray with a Gaussian profile, which does not have an infinitesimally small beam cross section, but rather an extended one.

In accordance with the prior art, long laser lines (e.g. greater than 100 mm) are only created by a correspondingly large spacing between light source and line. In this case, the spacing is typically at least as large as the line is long. It is often the case in industrial applications that so much space is not available, particularly in the case of line lengths of more than one meter.

BRIEF SUMMARY OF THE INVENTION

The object on which the present invention is based lies in the creation of an illumination apparatus of the type mentioned at the outset, for generating a line-shaped intensity distribution in a working plane, which illumination apparatus has a more compact design than the illumination apparatuses known from the prior art and supplies a high intensity.

According to the invention, this object is achieved by an illumination apparatus with the features of the claims.

The dependent claims relate to preferred developments of the invention.

According to the invention, an illumination apparatus for generating a line-shaped intensity distribution in a working plane comprises at least one group of laser light sources which are arranged one above the other in a number N of rows with respectively a number M of laser light sources arranged next to one another in such a way that they can emit laser light in a first propagation direction, a number of beam deflection means which are arranged behind the laser light sources in the first propagation direction and designed in such a way that they can deflect the laser light emitted by the laser light sources into a second propagation direction with respect to the working plane, beam merging means which are arranged behind the beam deflection means in the second propagation direction in such a way that they can merge the individual laser beams from the laser light sources into the line-shaped intensity distribution, wherein adjacent rows are arranged offset with respect to one another in a first direction (x-direction) perpendicular to the first and second emission direction on the one hand and in the first propagation direction (z-direction) on the other hand in such a way that the laser beams from the laser light sources can enter the beam merging means without overlap. With the aid of the illumination apparatus presented here, it is possible to generate a line-shaped intensity distribution of great length in a working plane. An advantage of the solution according to the invention consists of the fact that there are no losses as a result of overlaps of the laser beams because these are merged in two mutually independent stages to form the line-shaped intensity distribution in the working plane. Each one of the laser beams from a laser light source of the illumination apparatus merely interacts with two optical elements when generating the line-shaped intensity distribution; to be precise, with a beam deflection means, which deflects the relevant laser beam in the direction of the working plane, and with the beam merging means. As a result of these measures, it is possible to generate a line-shaped intensity distribution with high quality in the working plane. It is also possible to use additional lens means in the beam path of the illumination apparatus for forming the waist of the laser beams. However, these do not take part in the actual procedure of merging the laser beams to form the line-shaped intensity distribution. Overall, the illumination apparatus according to the invention can, in an advantageous manner, have a significantly more compact design than the solutions known from the prior art. The laser light sources preferably have an identical—more particularly module-like—design and each have a height H and a width P. The laser light sources are preferably embodied as semiconductor laser light sources.

In a preferred embodiment, provision is made for adjacent rows of laser light sources to be respectively arranged offset with respect to one another by a constant distance dx in the first direction (x-direction). Adjacent rows can preferably be respectively arranged offset with respect to one another by a distance dx=P/N in the first direction (x-direction), where P is the width of the laser light sources (extent of the laser light sources in the first direction, in which the laser light sources are arranged next to one another).

In an advantageous embodiment, provision can be made for the laser beams to be able to enter the beam merging means in a first plane, which has a spacing Y=Y1 from the working plane, and to be able to re-emerge from the beam merging means in a second plane, which has a spacing Y=Y2 from the working plane.

In a particularly advantageous embodiment, it is proposed that the spacing between the two planes in the y-direction $\Delta Y12 = Y1-Y2$ is approximately 2T to 3T, where T is the waist size of the laser beams in the first propagation direction (z-direction). In particular, the spacing of the planes $\Delta Y12$ can be selected in such a way that the laser beams can be merged in the second plane without losses to form a line-shaped intensity distribution. In the process, the optical path difference stays the same everywhere. In particular, this can be achieved by virtue of the fact that, for example, the second row of laser light sources is displaced by $H+\Delta$ in the z-direction with respect to the first row, the third row of laser light sources is displaced by $H-\Delta$ with respect to the second row, and so on.

In a preferred embodiment of the illumination apparatus, provision is made for the beam merging means to comprise a number of glass plates, which are arranged in such a way that the laser beams can be refracted at the optical interfaces of the glass plates in such a way that the laser beams can be merged to form the line-shaped intensity distribution. As a result of this, it is possible to create a line-shaped intensity distribution with particularly high quality in the working plane. In a particularly preferred embodiment, provision is made for the glass plates to be arranged such that they cross one another in pairs. By way of example, the glass plates can be arranged tilted at an angle of 45° with respect to the xz-plane. However, reference should be made at this point to the fact that the angle between the glass plates and the xz-plane does not necessarily have to be 45°.

By way of example, in a particularly advantageous embodiment, the beam deflection means can be embodied as mirror means.

During operation, the laser light sources emit laser light which initially propagates in the first propagation direction (z-direction). The laser beams from the laser light sources are individually deflected by 90° into the y-direction with the aid of mirror means and hence into the direction of the working plane (xz-plane). There is the option of respectively providing a single mirror means directly associated with a laser light source for each of the laser light sources in order to deflect the laser light emitted by the relevant laser light source. Alternatively, it is respectively possible to provide a single common mirror means for each of the rows of laser light sources.

In a further advantageous embodiment, provision can also be made for the illumination apparatus to have at least one second group of laser light sources which is arranged in a mirror-imaged fashion with respect to the first group of laser light sources. The line-shaped intensity distribution in the working plane is generated by the laser light sources from the two groups. The second group of laser light sources can in turn in particular have the features listed in claims 1 to 9 in respect of the first group of laser light sources.

Further features and advantages of the present invention become clear on the basis of the following description of preferred exemplary embodiments, with reference being made to the attached figures. In these:

BRIEF DESCRIPTION OF THE SEVERAL VIEWS OF THE DRAWING

FIG. 3a shows a lateral view of the illumination apparatus as per FIG. 1;

FIG. 3b shows a top view of the illumination apparatus as per FIGS. 1 and 3a;

FIG. 5b shows a top view of the illumination apparatus as per FIG. 5a;

DESCRIPTION OF THE INVENTION

Figure 1:
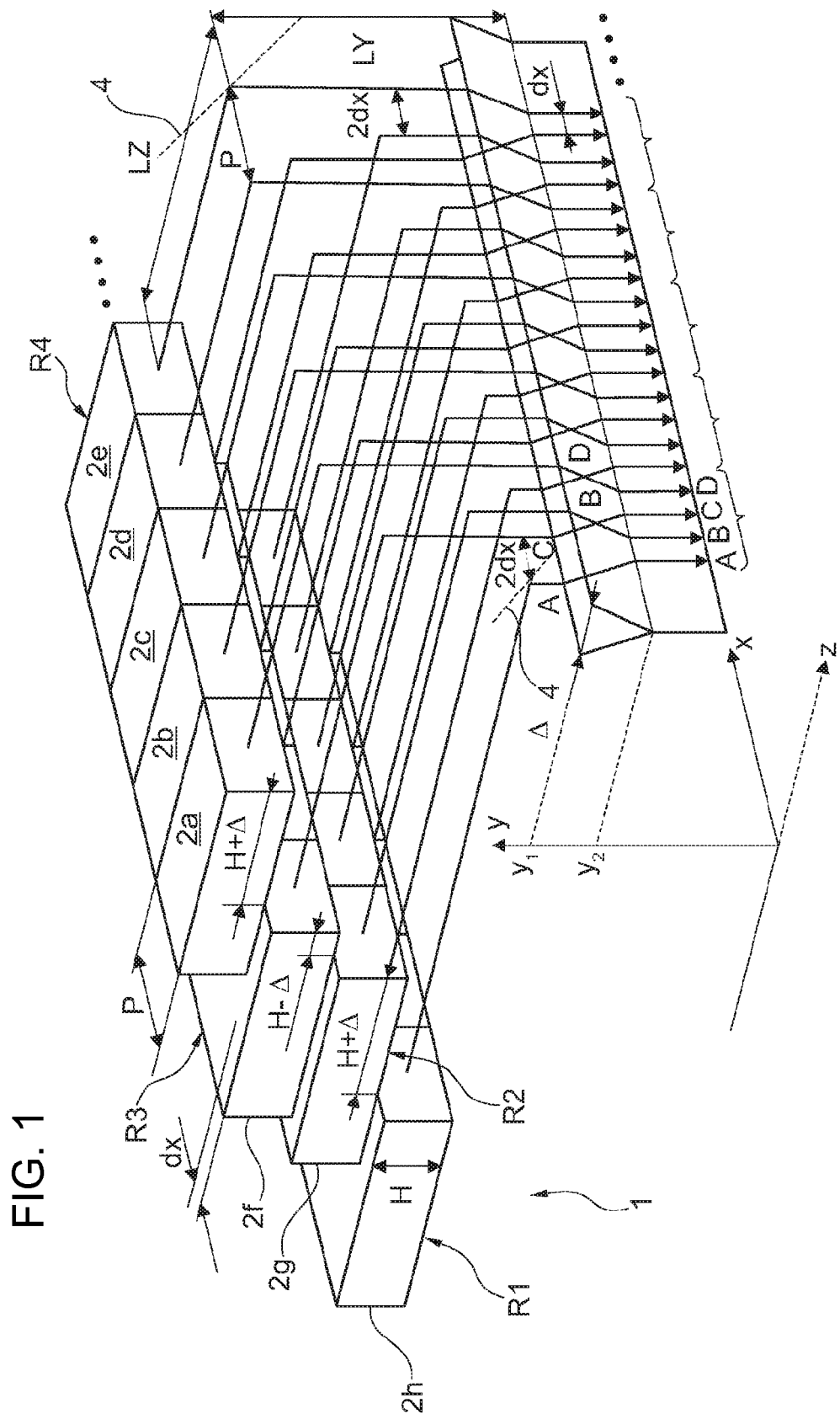
FIG. 1 shows a perspective illustration of an illumination apparatus which is embodied in accordance with a first exemplary embodiment of the present invention.

Initially reference is made to FIG. 1, which, in a perspective illustration, shows an illumination apparatus 1 which is embodied in accordance with a first preferred exemplary embodiment of the present invention. Furthermore, in order to simplify the further illustration, FIG. 1 illustrates a Cartesian coordinate system, which defines the x-direction, the y-direction and the z-direction.

The illumination apparatus 1 has a number of laser light sources 2, 2a-2h, which have a module-like design and preferably respectively comprise a laser diode as emitter. In the present case, the laser light sources 2, 2a-2h have an identical design and each have a height H and a width P. In the present case, the laser light sources 2, 2a-2h are arranged next to one another in four rows R1, R2, R3, R4 in the x-direction and stacked one above the other in the y-direction. Reference should already be made at this point to the fact that, in order to simplify the illustration, the number of rows R1, R2, R3, R4 illustrated in the drawing was restricted to N=4 and that in each of these four rows respectively M=5 laser light sources 2, 2a-2h are arranged next to one another. Reference should explicitly be made to the fact that, depending on the line length to be created by means of the illumination apparatus 1, substantially more than five laser light sources 2, 2a-2h can be arranged next to one another in the x-direction.

It becomes clear that adjacent rows R1, R2, R3, R4 of laser light sources 2, 2a-2h are respectively displaced in the x-direction by a distance dx. This displacement dx of adjacent rows R1, R2, R3, R4 in the x-direction is constant for all rows R1, R2, R3, R4, wherein, in general form, the following can more particularly apply: dx=P/N. As mentioned above, N is the number of rows R1, R2, R3, R4 (four in the present case) and P is the extent of the laser light sources 2, 2a-2h in the x-direction (width), which is identical in the case of the laser light sources 2, 2a-2h with the module-like design. In the y-direction, the laser light sources 2, 2a-2h are arranged directly above one another such that the "displacement" of adjacent rows R1, R2, R3, R4 of laser light sources 2, 2a-2h in the y-direction corresponds to the height H of the laser light sources 2, 2a-2h.

During operation, the laser light sources 2, 2a-2h emit laser light, which initially propagates in a first beam propagation direction (z-direction). The laser beams from the laser light sources 2, 2a-2h are deflected individually with the aid of beam deflection means, more particularly with the aid of mirror means, by 90° into a second beam propagation direction (y-direction) and hence into the direction of the working plane (xz-plane). There is the option of respectively providing each of the laser light sources 2, 2a-2h with its own beam deflection means (more particularly mirror means) in order to deflect the laser light emitted by the relevant laser light source 2, 2a-2h by 90° into the direction of the working plane. As an alternative to this, respectively one beam deflection means (more particularly mirror means) can be provided for each of the rows R1, R2, R3, R4 of laser light sources 2, 2a-2h. Thus, provision can be made for a mirror means 4 to be arranged behind the fourth row R4 in the beam propagation direction (z-direction), which mirror means deflects the laser light emitted by the laser light sources 2a-2h by 90° into the y-direction. In FIG. 1, merely two individual mirror means 4 are indicated in an exemplary fashion in the form of dashed lines in order not to make the drawn illustration more complicated.

At first sight, it appears as if the displacement of adjacent rows R1, R2, R3, R4 of laser light sources 2, 2a-2h in the first beam propagation direction (z-direction) should correspond to the vertical displacement H so that the condition of equality of the optical path lengths is satisfied. According to this, the distance from the beam emission window of each laser light source 2, 2a-2h to the point of generating the line-shaped intensity distribution (Y=Y2) should be identical for all laser light sources 2, 2a-2h and equal to LY+LZ. As will be explained below, this approach, which at first sight by all means appears obvious, leads to problems which can be avoided with the aid of the measures according to the invention.

Figure 2A:
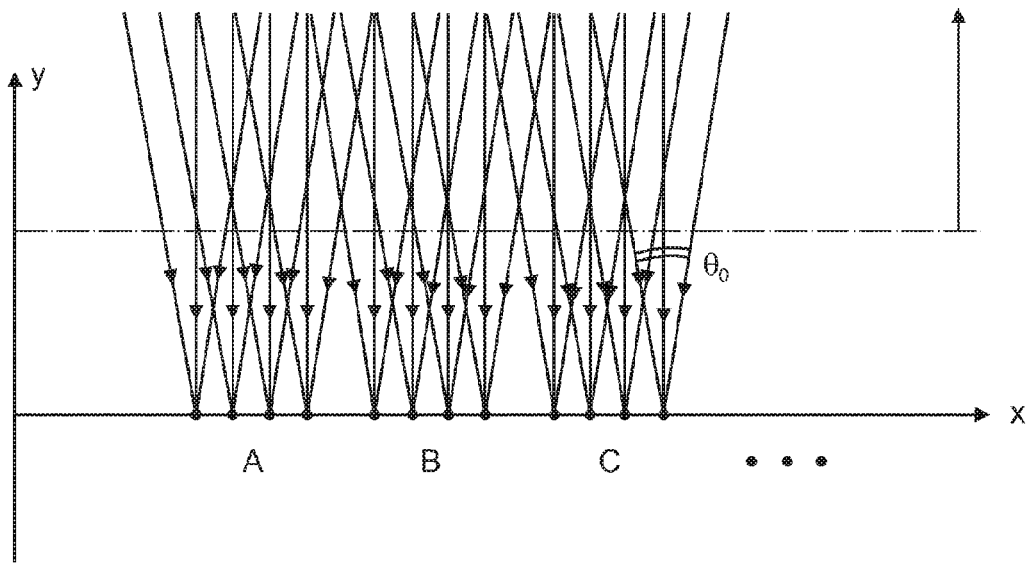
FIGS. 2a, 2b show two views rotated with respect to one another by 90° in a Cartesian coordinate system, which illustrate the problem known from the prior art of adjacent laser beams overlapping.
Figure 2B:
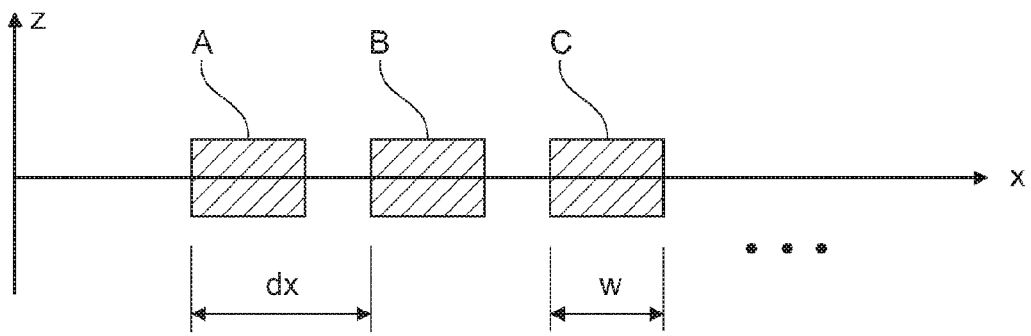
Figure 4A:
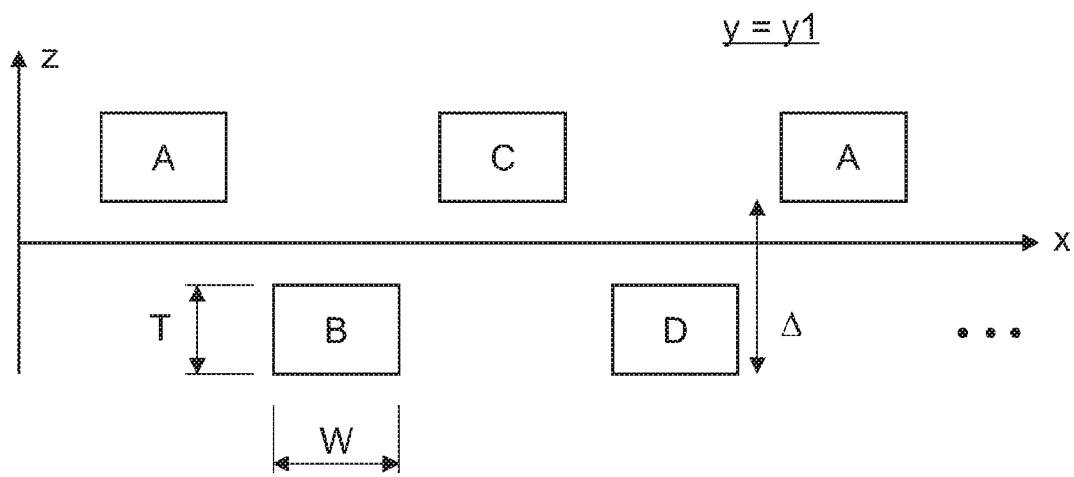
FIGS. 4a, 4b show two schematically much simplified views, which illustrate the beam pattern that can be obtained by means of the illumination apparatus as per FIGS. 1, 3a and 3b in two different xz-planes which are spaced apart from one another in the beam propagation direction.
Figure 4B:
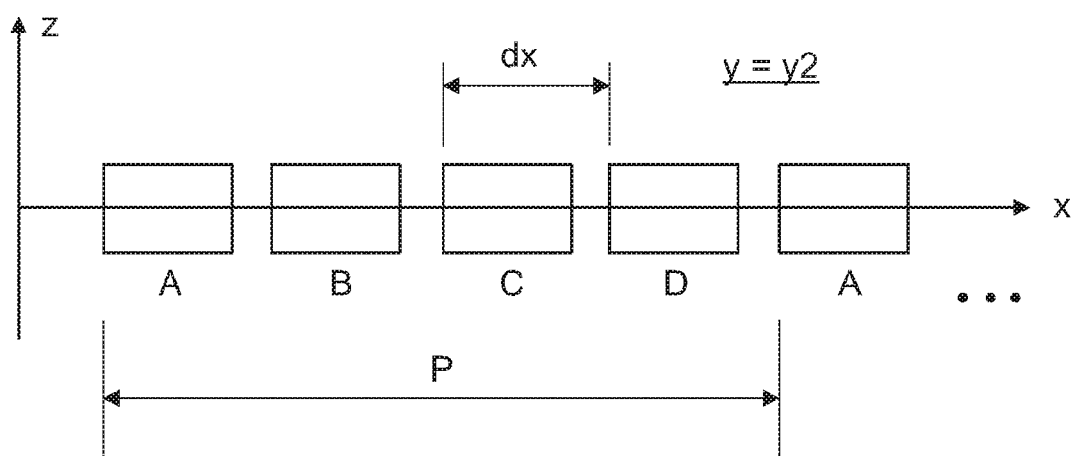

The main object that should be achieved with the illumination apparatus 1 described here consists of the fact that the brightness of the illuminated line should be as high as possible in the working plane. This means that the laser light emitted by each laser light source 2, 2a-2h should have a beam waist in the plane in which individual laser beams are merged to form a line, as illustrated schematically in FIGS. 2a and 2b. As can be identified in FIG. 2a, this condition cannot be satisfied directly because there is a zone of overlap of the laser beams A, B, C in the beam return up to this point. With respect to the working plane, this region of overlap, which was indicated in FIG. 2a by a horizontal line, lies higher than the point of merging of the laser beams A, B, C to form a line-shaped intensity distribution. Here, these laser beams A, B, C must be provided by separate lens channels.

The prior art has disclosed different methods for merging the beam waists with maximally tight packing. By way of example, lens optical waveguides or cavity optical waveguides are used for this purpose. In this context, lens optical waveguides are more advantageous and therefore more preferred because the production thereof offers technological advantages. Here, the spacing LW between the lenses when keeping the field within the beam waist with the extent W in the x-direction with the full divergence $\Theta_0$ (in radians) should be $LW=W/\Theta_0$ in paraxial approximation. In practice, it has been found that this period is substantially smaller than the overall height H*N of the illumination apparatus 1. This means that the lens optical waveguide must consist of a number of periods, which would make the constructive design of the illumination apparatus significantly more difficult.

In the illumination apparatus 1 presented here, this problem is avoided by virtue of the fact that the laser beams from the laser light sources 2, 2a-2h are converted into the line-shaped intensity distribution in two mutually independent stages. In a first step, the laser beams A, B, C, D from laser light sources 2a, 2f, 2g, 2h arranged above one another are routed into a first plane (xz-plane) at a height Y=Y1, wherein adjacent laser beams A, B, C, D in the z-direction in pairs have an offset A with respect to one another in the z-direction. The laser beams A, B, C, D are subsequently merged to form a line-shaped intensity distribution in a second plane (xz-plane) at a height Y=Y2, for example with the aid of flat glass plates 5, 6 which cross one another.

In order not to make the drawn illustration more complicated, these glass plates 5, 6 have not been illustrated in FIG. 1. All that is illustrated in FIG. 1 is the beam profile of the laser beams A, B, C, D (and also of the remaining laser beams not provided in any more detail with a reference sign) when passing through the glass plates 5, 6. The arrangement of the glass plates 5, 6 in the beam path of the illumination apparatus 1 can be seen from FIG. 3a. The glass plates 5, 6 are arranged in such a way that the laser beams A-L can be refracted at the optical interfaces of the glass plates 5, 6 in such a way that the laser beams A-L can be merged to form the line-shaped intensity distribution. In the present case, the glass plates 5, 6 include an angle of 45° with the xz-plane. However, reference should be made at this point to the fact that the angle by which the glass plates 5, 6 are tilted with respect to the xz-plane does not necessarily have to equal 45°. The intensity distributions in the first plane at Y=Y1 and in the second plane at Y=Y2 are illustrated in FIGS. 3a and 3b. In FIG. 3a, it is possible, in particular, to identify the offset A of adjacent laser beams A, B, C, D in the z-direction.

Here, the spacing between the two planes in the y-direction $\Delta Y12=Y1-Y2$ can advantageously be minimized down to a size of approximately 2T to 3T, where T is the waist size of the laser beams A, B, C, D in the z-direction. If $\Delta Y12$ is so small that $\Delta Y12 \ll LW$ applies, the laser beams A, B, C, D can be merged to form a line-shaped intensity distribution without losses on account of overlaps. Here, the optical path difference stays the same everywhere. This is achieved by virtue of the fact that, for example, the row R2 is displaced by H+Δ in the z-direction with respect to the row R1, the row R3 is displaced by H−Δ with respect to the row R2, and so on, as can be identified in FIG. 1 and in FIG. 3a in particular.

With the aid of the illumination apparatus 1 presented here, it is possible to generate a line-shaped intensity distribution with a high beam quality in the working plane.

Figure 5A:
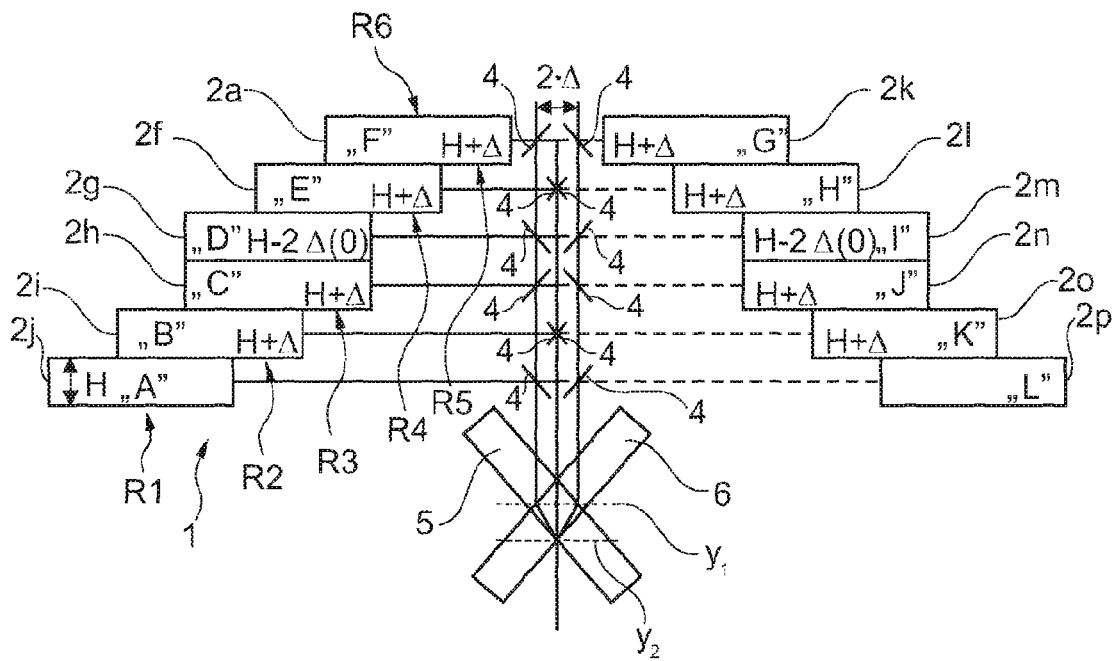
FIG. 5a shows a lateral view of an illumination apparatus, which is embodied in accordance with a second exemplary embodiment of the present invention.
Figure 5B:
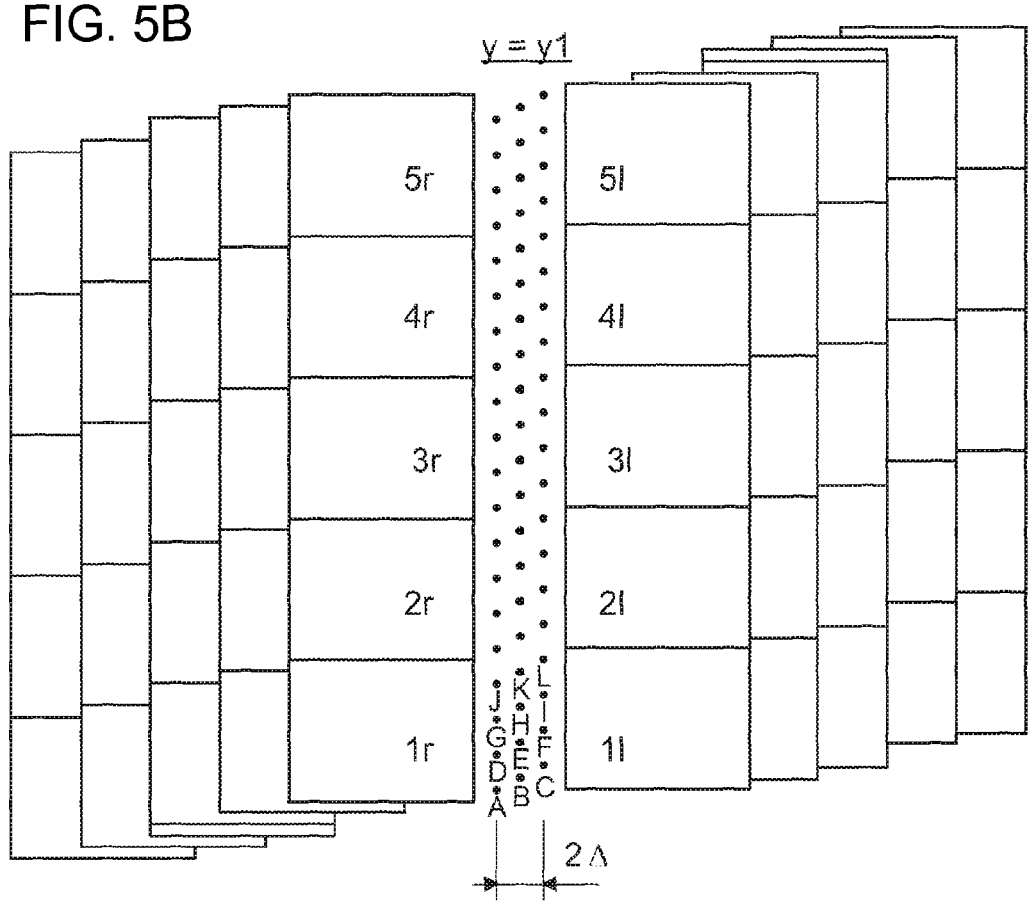

Referring to FIG. 5, a second exemplary embodiment of the present invention is shown therein. While an individual group of laser light sources 2, 2a-2h was provided in the illumination apparatus 1 as per the first exemplary embodiment, the illumination apparatus 1 in the exemplary embodiment illustrated here has two groups of laser light sources 2, 2a-2j (on the left-hand side in FIGS. 5a and 5b) and 2, 2k-2p (on the right-hand side in FIGS. 5a and 5b).

The two groups of laser light sources 2, 2a-2j and 2, 2k-2p are embodied in a mirror-imaged fashion with respect to one another and, during operation, emit laser light in mutually opposing beam propagation directions in the z-direction. In the present case, the laser light sources 2, 2a-2j and 2, 2k-2p of each of the two groups are arranged one above the other in six rows R1 to R6, wherein a total of five laser light sources 2, 2a-2j, 2, 2k-2p are arranged next to one another in each of the rows.

As was already the case in the first exemplary embodiment, the laser beams A-L are deflected individually by 90° into the y-direction with the aid of beam deflection means, more particularly with the aid of mirror means 4, and hence deflected into the direction of the working plane (xz-plane). Which of the beam deflection means (mirror means 4 in the present case) are associated with which laser beams A-L emerges from FIG. 3a in conjunction with FIG. 3b. There is the option of providing respectively one beam deflection means (more particularly mirror means) for each of the laser light sources 2, 2a-2j, 2, 2k-2p, in order to deflect the laser light emitted by the relevant laser light source 2, 2a-2h and 2, 2k-2p by 90°. Alternatively, respectively one beam deflection means (more particularly mirror means) can be provided for each of the rows R1, R2, R3, R4, R5, R6 of laser light sources 2, 2a-2j and 2, 2k-2p.

Figure 6A:
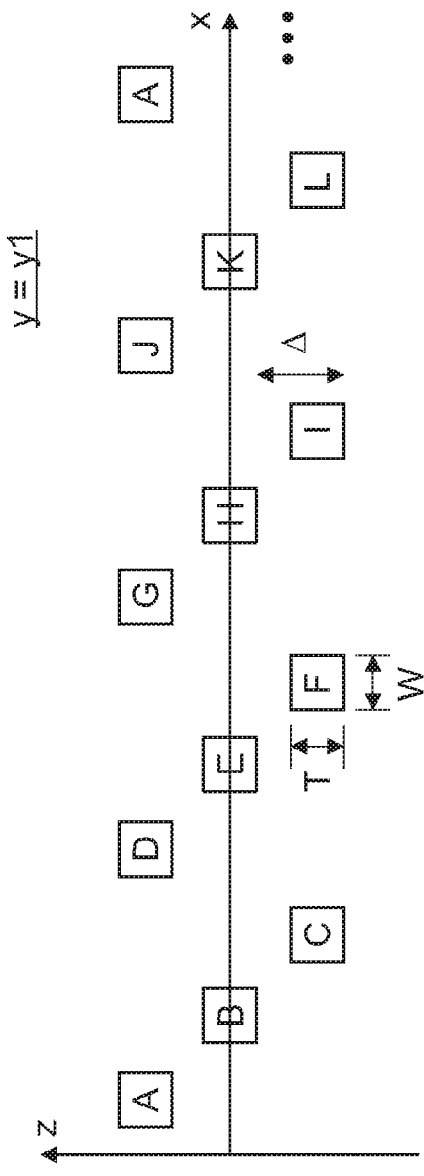
FIGS. 6a, 6b show two schematically much simplified views, which illustrate the beam pattern that can be obtained by means of the illumination apparatus as per FIGS. 5a, 5b in two different xz-planes which are spaced apart from one another in the beam propagation direction.
Figure 6B:
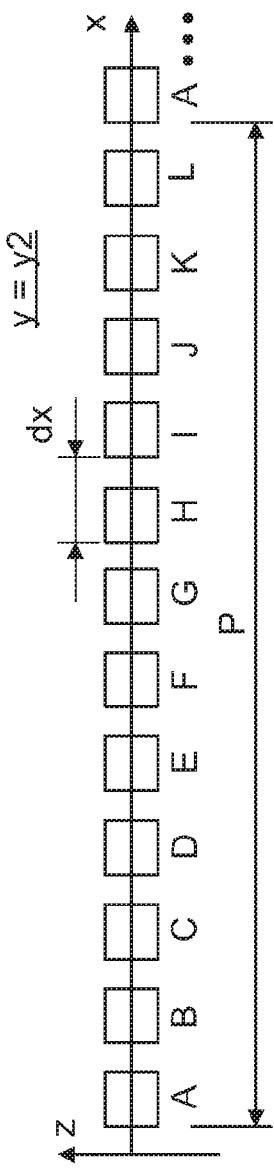

The laser beams deflected in this manner are in turn converted into a line-shaped intensity distribution in the working plane in two steps in the above-described manner with the aid of flat glass plates 5, 6. Said glass plates are arranged such that they cross one another, as described above. In the present case, the glass plates 5, 6 once again include an angle of 45° with the xz-plane. However, reference should once again be made at this point to the fact that the angle between the glass plates 5, 6 and the xz-plane does not necessarily have to equal 45°. Now there are not two, but rather three rows of light bundles A-L in the first xz-plane at Y=Y1 (see FIG. 6a) which are unified to form a line in the second xz-plane at Y=Y2 (FIG. 6). To this end, it is possible to arrange a plurality of flat glass plates 5, 6 which cross one another in pairs, preferably in the form of an array.

The laser light sources 2, 2a-2j, 2, 2k-2p are once again arranged offset with respect to one another in both the x-direction and the z-direction in the manner described above. Adjacent rows R1 to R6 are offset with respect to one another by the constant distance dx (preferably dx=P/N also applies here). The offset of adjacent rows R1, R2, R3, R4, R5, R6 of laser light sources 2, 2a-2j and 2, 2k-2p in the first beam propagation direction (z-direction) emerges directly from FIG. 5a.

The main peculiarities of the geometric arrangements of the laser light sources 2, 2a-2h and 2, 2a-2j, 2k-2p presented here consist of the fact that the laser light sources 2, 2a-2h and 2, 2a-2j, 2k-2p with the module-like design are combined in a three-dimensional stack row-by-row with an offset in the x-direction and also with an offset in the z-direction, without particular angular settings of the laser light sources 2, 2a-2h and 2, 2a-2j, 2k-2p being used in the process.

Advantageously, there are no losses on account of overlaps of the laser beams, because these are merged to form the line-shaped intensity distribution in two stages, as described above.

Each of the laser beams from a laser light source 2, 2a-2h and 2, 2a-2j interacts with no more than two optical elements, to be precise with a beam deflection means 4, which can more particularly be a beam deflection mirror, and with respectively one of the flat glass plates 5, 6. Within the beam paths, use can be made of additional lens means for forming the waist. These do not take part in the procedure of merging the laser beams to form the line-shaped intensity distribution.

The invention claimed is:

1. An illumination apparatus for generating a line-shaped intensity distribution in a working plane, the illumination apparatus comprising:
   at least one group of laser light sources disposed one above another in a number N of rows with respectively a number M of said laser light sources disposed next to one another such that said laser light sources can emit laser light in a first propagation direction;
   a number of beam deflection devices disposed behind said laser light sources in the first propagation direction and configured such that said beam deflection devices can deflect the laser light emitted by said laser light sources into a second propagation direction with respect to the working plane;
   a beam merging device disposed behind said beam deflection devices in the second propagation direction such that said beam merging device can merge individual laser beams from said laser light sources into the line-shaped intensity distribution; and
   wherein adjacent rows of said laser light sources disposed offset with respect to one another in a first direction perpendicular to a first and second emission direction on the one hand and in the first propagation direction on the other hand such that the laser beams from said laser light sources can enter said beam merging device without overlap.

2. The illumination apparatus according to claim 1, wherein said adjacent rows of said laser light sources are respectively disposed offset with respect to one another by a constant distance dx in the first direction.

3. The illumination apparatus according to claim 2, wherein said adjacent rows of said laser light sources are respectively disposed offset with respect to one another by a distance dx=P/N in the first direction, where P is a width of said laser light sources.

4. The illumination apparatus according to claim 1, wherein the laser beams can enter said beam merging device in a first plane, which has a spacing Y=Y1 from the working plane, and can re-emerge from said beam merging device in a second plane, which has a spacing Y=Y2 from the working plane.

5. The illumination apparatus according to claim 4, wherein the spacing between the first and second planes in the y-direction $\Delta Y12 = Y1 - Y2$ is approximately 2T to 3T, where T is a waist size of the laser beams in the first propagation direction.

6. The illumination apparatus according to claim 5, wherein the spacing of the planes $\Delta Y12$ is selected in such a way that the laser beams can be merged in the second plane without losses to form the line-shaped intensity distribution.

7. The illumination apparatus according to claim 1, wherein said beam merging device contains a number of glass plates with optical interfaces, said glass plates disposed such that the laser beams can be refracted at said optical interfaces of said glass plates such that the laser beams can be merged to form the line-shaped intensity distribution.

8. The illumination apparatus according to claim 7, wherein said glass plates are disposed such that they cross one another in pairs.

9. The illumination apparatus according to claim 1, wherein said beam deflection devices are mirror devices.

10. The illumination apparatus according to claim 1, further comprising at least one second group of said laser light sources disposed in a mirror-imaged fashion with respect to said first group of said laser light sources.

* * * * *